United States Patent
Pulvirenti

(10) Patent No.: US 6,366,154 B2
(45) Date of Patent: Apr. 2, 2002

(54) METHOD AND CIRCUIT TO PERFORM A TRIMMING PHASE

(75) Inventor: Francesco Pulvirenti, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/770,837

(22) Filed: Jan. 26, 2001

(30) Foreign Application Priority Data

Jan. 28, 2000 (EP) ............................................. 00830059

(51) Int. Cl.[7] .............................................. H01H 85/00
(52) U.S. Cl. ......................................... 327/525; 327/77
(58) Field of Search ............................. 327/77, 90, 525

(56) References Cited

U.S. PATENT DOCUMENTS

| | | | |
|---|---|---|---|
| 5,396,130 A | 3/1995 | Galbraith et al. | ............ 326/102 |
| 5,450,030 A | * 9/1995 | Shin et al. | ................... 327/525 |
| 5,712,575 A | 1/1998 | Ma et al. | ..................... 324/763 |
| 6,130,571 A | * 10/2000 | Yamamoto | ................... 327/525 |

FOREIGN PATENT DOCUMENTS

EP 0 578 252 A2 1/1994

* cited by examiner

*Primary Examiner*—Jeffrey Zweizig
(74) *Attorney, Agent, or Firm*—Lisa K. Jorgenson; Stephen Bongini; Fleit, Kain, Gibbons, Gutman & Bongini P.L.

(57) ABSTRACT

A method is provided for carrying out a trimming operation on an integrated circuit having a trimming circuit portion which includes memory elements and a modification circuit for modifying the state of the memory elements, at least a first input or supply pin, an output pin, and a second supply pin. According to the method, a single pin is enabled to receive trimming data by biasing the pin to outside its operating range. A clock signal is obtained from a division of the bias potential of the pin, and the logic value of the trimming data is obtained from a different division of the bias potential of the pin. Serial acquisition of the data is enabled in accordance with the clock signal, and the data is transferred to the modification circuit.

23 Claims, 2 Drawing Sheets

METHOD AND CIRCUIT TO PERFORM A TRIMMING PHASE

BACKGROUND OF THE INVENTION

1. Field of the Invention

The present invention relates to integrated circuits, and more specifically to a method for carrying out a trimming operation in a closed condition and to a corresponding trimming circuit.

2. Description of Related Art

This present invention relates, particularly but not exclusively, to an improved method for carrying out a trimming operation on integrated circuits having a trimming circuit portion which includes memory elements and means of modifying the state of such memory elements, at least a first input or supply pin, an output pin, and a second supply pin. The present invention also relates to an electronic circuit for carrying out a trimming operation on portions of integrated circuits having at least a first input or supply pin, an output pin, and a second supply pin, the electronic circuit including at least memory elements and a means of modifying the state of such memory elements.

On completion of a conventional integrated circuit fabrication process (e.g. after the packaging operation), a circuit calibrating or "trimming" operation is carried out. For example, it may be necessary to "trim" or "tune" the output voltage Vout of a voltage regulator. The trimming of an integrated circuit is usually performed at the EWS (Electrical Wafer Sort) test stage, that is while the circuit is still held to the wafer of semiconductor material. However, in certain cases especially those commanding high precision, the trimming is also applied at the final testing stage, that is after the packaging operation.

Pins must be made available to access the integrated circuit for trimming purposes, either in the form of specially arranged pins or of multi-function pins which are biased to outside their normal range of operating values and allow the trimming operation to be selected and activated. However, some integrated circuits often have a very limited number of pins. For example, a linear voltage regulator may include no more than a supply pin, an output pin and a ground pin. With so small a number of pins, it is practically impossible to carry out post-packaging trimming operations, and in such cases the trimming must be performed on-wafer.

To better appreciate the problems involved in a trimming operation, reference can be made to the accompanying FIG. 1, in which a linear voltage regulator incorporating a prior art trimming circuit is depicted schematically.

The regulator of FIG. 1 is intended for applications with a small voltage drop between the input and the output. This regulator includes: a power transistor PT representing the regulating element; an error amplifier OPAMP driving the power transistor; a charge pump voltage booster circuit CHARGE PUMP providing a boosted voltage to the control terminal of the power transistor; an internal voltage reference BANDGAP REFERENCE; and a voltage divider which comprises a pair of resistors R1 and R2 and is used to fix the value of the output voltage. This voltage regulator further includes a trimming circuit for on-wafer application. The voltage divider and error amplifier form a negative feedback regulating loop.

The trimming circuit comprises a selection portion SELECTION LOGIC based on a combinational logic, and a memory portion. The selection portion acts directly on the calibrating elements, and the memory elements can be accessed from zapping pins through which a voltage or current can be forced.

The memory elements may be, for example: ZAP-type Zener diodes, being components which perform in an open circuit mode until the voltage across them exceeds a predetermined threshold value, and when this threshold is exceeded while a large current (such as a few hundred mA) is being flowed, the ZAP diode changes its characteristic permanently and, in particular, becomes a resistive component (such as of a few Ohms); integrated fuses which change their state from short circuit to open circuit upon an appropriate current being passed therethrough; and integrated non-volatile memories (EEPROMs, EPROMs, etc.) wherein a suitable sequence of bits is stored for subsequent use, by appropriate circuitry, to force integrated microswitches to the closed or the open state.

The solutions based on the use of diodes or fuses have an advantage in that they involve no complex managing circuitry. In fact, the forcing of a voltage and/or a current is all that is required in order to set the memory elements. However, they do require dedicated contact pins for addressing each component at the EWS testing stage. Thus, if a post-packaging trimming is to be carried out, additional pins must be provided for the purpose.

The solution based on the use of integrated memories can indeed work with a smaller number of pins. In fact, no more than two pins need to be added, one for a serial data input and another for placing the device in the trimming mode. In some instances, these two additional inputs can be obtained exploiting a third logic level at some pin which are already in the integrated circuit. Where at least two pins arc available in the circuit, this operation would be carried out using the Reset and Enable pins; for example, the RESET function is taken away from the managing logic and assigned to the affected analog part.

These methods do afford savings in the number of pins required, but have the following disadvantages. They require a huge silicon area for the circuitry arranged to manage the trimming and writing into memory; this becomes a significant problem where the number of parameters to be trimmed is large. In devices realized with combined technologies, such as BCD technologies, the realization of integrated memories requires at least three additional masks to the basic process, thereby dilating manufacturing costs. It would be difficult, with integrated circuits having a small number of pins, to find two available pins among those provided and check the condition of the rest, considering that the entire operation is to be carried out with the device alive.

There is also a problem of "simulating" the effects of trimming; in fact, once data have been inserted and before writing them permanently into the memory, it would be possible to simulate the effects of the intended trimming operation. The "simulation" consists in closing and/or opening internal switches and measuring the values of the parameters to be trimmed. The measurements frequently need the device in a normal condition of its operation, so that the pin being used to enter the trimming mode must be allowed to operate as normal. However, this results in lost control of the trim handling circuitry.

SUMMARY OF THE INVENTION

In view of these drawbacks, it is an object of the present invention to overcome the above-mentioned drawbacks and to provide a new trimming method and circuitry with suitable functional and structural features to enable trimming operations to be carried out in a simple manner, without requiring pins other than those already present on the integrated circuit to be trimmed.

Another object of the present invention is to allow a single pin to be used to force an integrated circuit into a trimming mode and input serially both the simulation data and the trimming data proper. In this way, a single pin (e.g., used outside its operating voltage range) can be shared to enable the trimming circuitry and to input the data serially.

One embodiment of the present invention provides a method for carrying out a trimming operation on an integrated circuit having a trimming circuit portion which includes memory elements and a modification circuit for modifying the state of the memory elements, at least a first input or supply pin, an output pin, and a second supply pin. According to the method, a single pin is enabled to receive trimming data by biasing the pin to outside its operating range. A clock signal is obtained from a division of the bias potential of the pin, and the logic value of the trimming data is obtained from a different division of the bias potential of the pin. Serial acquisition of the data is enabled in accordance with the clock signal, and the data is transferred to the modification circuit. In a preferred embodiment, the data is transferred to selection logic with the modification circuit bypassed on the occurrence of a simulated trimming operation.

Another embodiment of the present invention provides an electronic circuit for carrying out a trimming operation on circuit portions of an integrated circuit having at least a first input or supply pin, an output pin, and a second supply pin. The circuit includes memory elements, means for modifying the state of the memory elements, and first and second comparators having their inputs connected to a trimming pin to produce a clock signal for the trimming operation and a sequence of trimming data. A single trimming pin is used. In one preferred embodiment, the first comparator has an input coupled to the trimming pin via a voltage divider, and the second comparator has an input coupled to the trimming pin via a different node of the voltage divider.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 2:
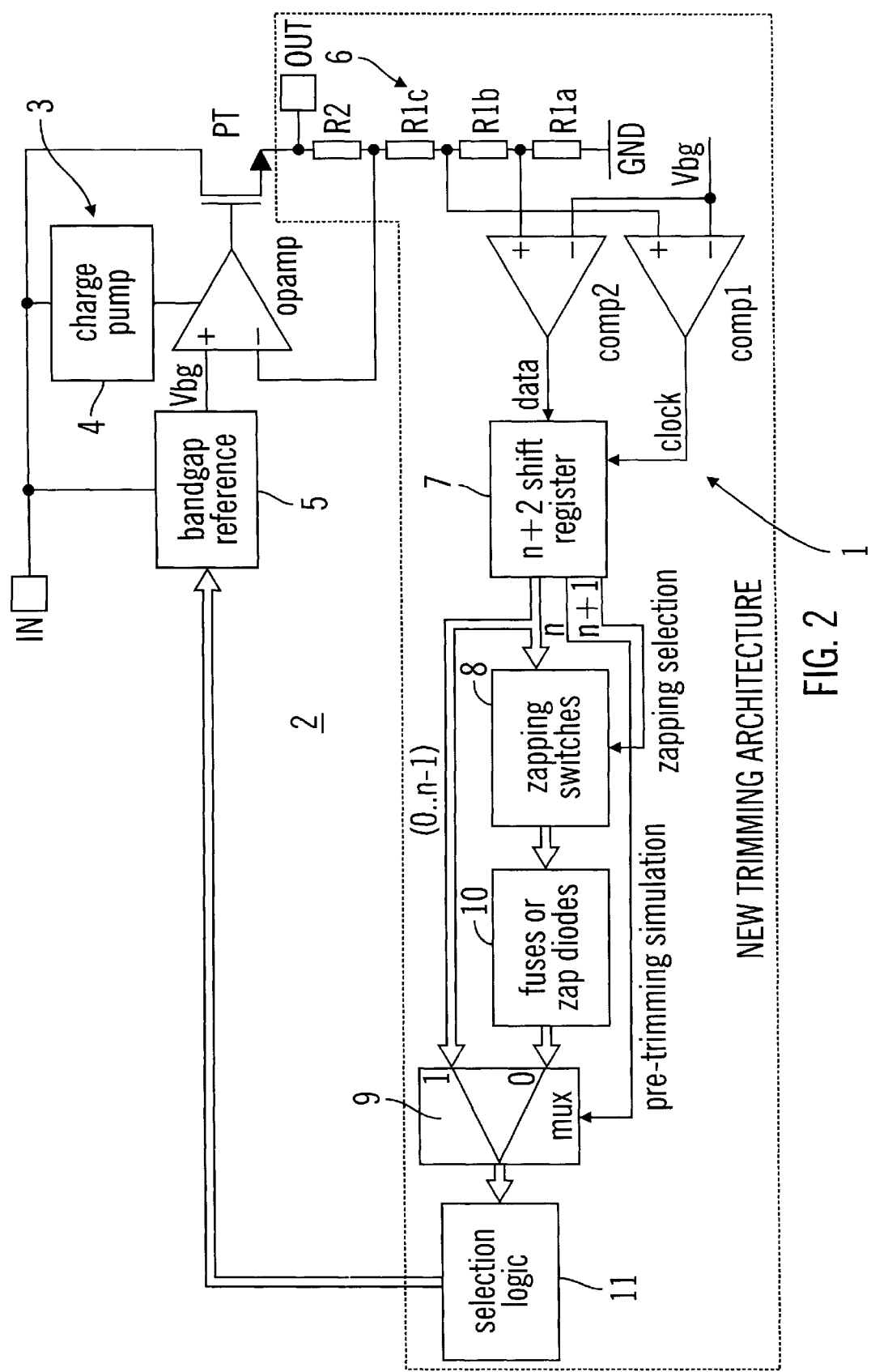
FIG. 2 shows an integrated circuit having a trimming circuit portion in accordance with a preferred embodiment of the present invention.

Referring to the example shown in FIG. 2, a trimming circuit portion for carrying out a trimming operation on an integrated circuit 2 incorporating the circuit portion, in accordance with a preferred embodiment of the present invention, is generally shown at 1 in schematic form. The integrated circuit 2 is a linear voltage regulator 3 having three access pins: a first input or supply pin IN, an output pin OUT, and a second supply pin which is a ground biased pin GND in this embodiment. (A different type of integrated circuit could be used, and the following discussion will not take into consideration the actual function of the integrated circuit 2. A voltage regulator 3 has been chosen for illustrative purposes only).

Advantageously in the present invention, the trimming mode is enabled by biasing the output pin OUT to outside its operating range, above a threshold voltage which is set by a comparator. In more detail, the voltage regulator 3 comprises: a power transistor PT which represents the regulating element; an error amplifier OPAMP driving the power transistor PT; a charge pump type of booster circuit 4 supplying a necessary boosted voltage to the control terminal of the power transistor; and an internal voltage reference 5, e.g. a bandgap reference. Unlike the conventional voltage regulator shown in FIG. 1, this regulator 3 includes a voltage divider 6 connected between the output pin OUT and the ground pin GND and comprising a series of resistors R1a, R1b, R1c, R2. The value of the output voltage Vout is set by the divider 6.

The construction of the trimming circuit portion 1 associated with the voltage regulator 3 will now be described in detail. The trimming circuit portion 1 comprises a first comparator COMP1 and a second comparator COMP2, each having an inverting (−) input and a non-inverting (+) input. The inverting inputs (−) of the comparators are held at a potential Vbg supplied by the bandgap reference 5 output from the regulator 3. The non-inverting input of the first comparator COMP1 is connected to a node of the resistive divider 6, specifically to the interconnect node between the resistors R1b and R1c. The non-inverting input of the second comparator COMP2 is connected to a node of the resistive divider 6, specifically to the interconnect node between the resistors R1a and R1b.

The output of the first comparator COMP1 is connected to a clock input of a shift register 7 of "n+2" order or length. The output of the second comparator COMP2 is connected to a data input of the shift register 7. This shift register 7 has a set of n data outputs (0, . . . , n−1) connected directly to corresponding inputs of a block 8 of zapping switches. These n outputs are also connected to corresponding inputs of a multiplexer 9. The last two n and n+1 outputs of the register 7 are connected to the blocks 8 and 9. In particular, the n-th output is connected to a pre-trimming simulation input of the multiplexer 9, and the (n+1)-th output is connected to a selection input of the zapping switch block 8.

Memory elements or fuses 10, zap diodes, or any other suitable memory elements, are placed between the zapping switch block 8 and the multiplexer 9. Located downstream of the multiplexer 9 is a selection logic 11 having its output connected to the circuit portion to be calibrated, specifically to the bandgap reference 5.

An exemplary application of a method according to the present invention will now be described. As previously mentioned, the trimming mode is enabled by suitably biasing the output pin OUT to outside its normal operating range, thereby surpassing the threshold set by the first comparator COMP1. Exceeding this first threshold generates moreover a front of the clock signal which is useful to enable the shift register 7 to acquire data through the data input downstream of the second comparator COMP2. The clock signal is thus generated by reiterate crossings of the threshold of the first comparator COMP1.

The data sequence is input through the pin OUT and the second comparator COMP2. Exceeding the threshold of this comparator COMP2 requires in a higher potential being attained than the threshold of the first comparator COMP1, which enables the logic one and logic zero to be discriminated. More particularly, for a logic "zero" to be input, only the lower threshold that also clocks the clock signal need to be crossed, whereas to input a logic "one", both thresholds need to be exceeded. The trimming operation data are stored into the shift register. The first n bits represent the result itself, that is the state sought for the memory elements 10, and the last two bits are used to select between the trimming simulation and the actual trimming operation.

In particular, the n-th output of the block 7 selects the simulated trimming function through the corresponding input of the multiplexer 9, whereas the (n+1)-th output of the block 7 selects the actual trimming operation by operating the zapping switches in the block 8. The zapping switches fuses or zap diodes, act directly on the memory elements 10 which by forcing a voltage and/or current dependent on the type of element being used. In this way, the structure and state of the memory element are modified permanently.

Figure 1:
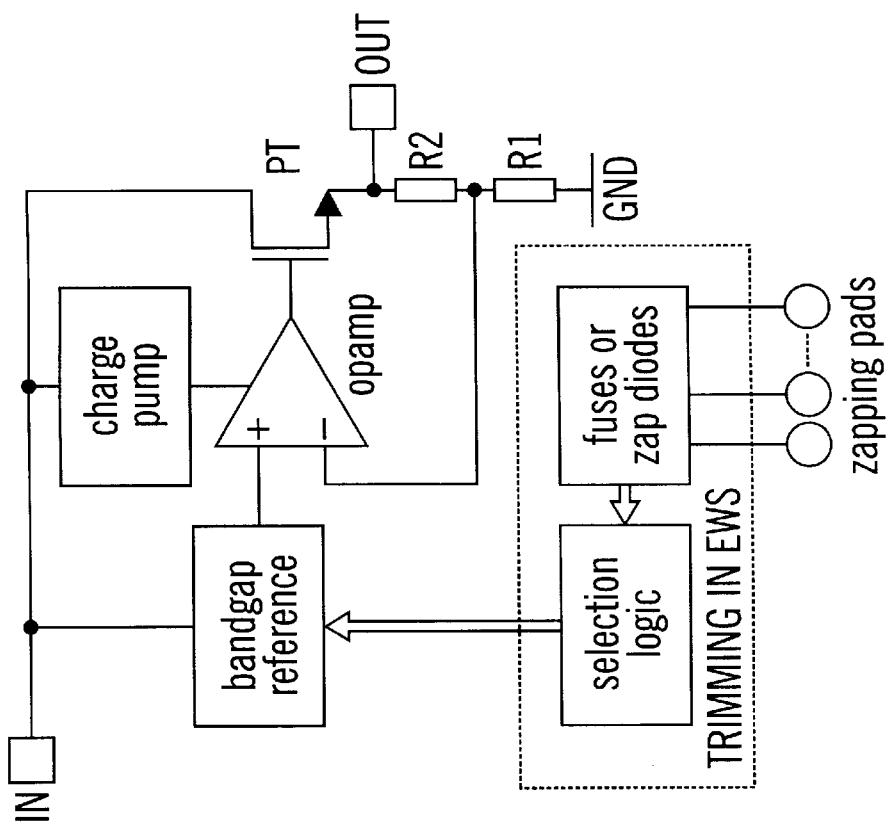
FIG. 1 is a block diagram of an integrated circuit including a conventional trimming circuit portion.

The selection logic 11 has the same function as that illustrated in FIG. 1. This logic is usually a combinational logic acting directly on the calibrating elements of the circuitry being calibrated which, in this exemplary embodiment, is represented by the bandgap reference block 5.

As previously explained, this method can be applied to any integrated circuits having at least one pin different from the input or supply pin and the ground pin.

Thus, the circuitry and method of the present invention solve the technical problem and offer several advantages. For example, in accordance with the present invention, the trimming operation can be carried out after the packaging operation, even on devices having a limited number of pins for connection to the outside world. Additionally, the device can be made to enter the trimming mode, and trimming data can be simultaneously input, by single-pin sharing. Further, the trimming circuit portion is quite simple and requires no internal clock signal to be generated.

As a practical example, the circuit portion of one embodiment of the present invention was implemented by the inventor in combination with a linear voltage regulator having an output voltage that could be calibrated at different values, namely 1.25V, 1.5V, 1.8V, 2.5V, 3.3V, and 5.0V. The clock signal generation threshold and the data input threshold were selected at 180% and 220% of the output voltage value. For example, with Vout=2.5V, the threshold of the first comparator COMP1 was set at 4.5V, and the threshold of the second comparator COMP2 was set at 5.5V.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for carrying out a trimming operation on an integrated circuit having a trimming circuit portion which includes memory elements and a modification circuit for modifying the state of the memory elements, at least a first input or supply pin, an output pin, and a second supply pin, said method comprising the steps of:
    enabling a single pin to receive trimming data by biasing the pin to outside its operating range;
    obtaining a clock signal from a division of the bias potential of the pin;
    obtaining the logic value of the trimming data from a different division of the bias potential of the pin;
    enabling serial acquisition of the data in accordance with the clock signal;
    transferring the data to the modification circuit.

2. The method according to claim 1, further comprising the step of transferring the data to selection logic with the modification circuit bypassed on the occurrence of a simulated trimming operation.

3. The method according to claim 1, wherein the transfer operation is earned out using a shift register.

4. The method according to claim 3, further comprising the step of supplying the shift register with the data on one input and the clock signal on another input.

5. The method according to claim 1, wherein the step of obtaining a clock signal includes the sub-step of comparing a division of the bias potential on the pin with a reference potential.

6. The method according to claim 1, wherein the step of obtaining the logic value of the trimming data includes the sub-step of comparing a division of the bias potential on the pin with a reference potential.

7. The method according to claim 1,
    wherein the step of obtaining a clock signal includes the sub-step of comparing a division of the bias potential on the pin with a reference potential,
    the step of obtaining the logic value of the trimming data includes the sub-step of comparing a division of the bias potential on the pin with a reference potential, and
    the trimming data logic value comparison threshold is higher than the comparison threshold used to obtain the clock signal.

8. An electronic circuit for carrying out a trimming operation on circuit portions of an integrated circuit having at least a first input or supply pin, an output pin, and a second supply pin, the circuit comprising:
    memory elements;
    means for modifying the state of the memory elements; and
    first and second comparators having their inputs connected to a trimming pin to produce a clock signal for the trimming operation and a sequence of trimming data,
    wherein a single trimming pin is used.

9. The circuit according to claim 8,
    wherein the first comparator has an input coupled to the trimming pin via a voltage divider, and
    the second comparator has an input coupled to the trimming pin via a different node of the voltage divider.

10. The circuit according to claim 9, further comprising a shift register connected downstream of the first and second comparators.

11. The circuit according to claim 10, wherein the shift register is of the n+2 order.

12. The circuit according to claim 10, wherein the means of modifying is connected downstream of the shift register.

13. The circuit according to claim 10, wherein the shift register receives trimming data on one input from the output of the second comparator, and receives a clock signal on another input from the output of the first comparator.

14. The circuit according to claim 10, wherein the shift register has its output connected to selection logic so as to bypass the means of modifying on the occurrence of a simulation of the trimming results.

15. The circuit according to claim 14, further comprising a multiplexer coupled between the outputs of the shift register and the selection logic.

16. The circuit according to claim 15, wherein an n-th output of the shift register is connected to an input of the multiplexer to select a simulated trimming operation.

17. The circuit according to claim 14, wherein the selection logic has its output connected to a voltage reference of the circuit portion producing a reference voltage signal for the integrated circuit.

18. The circuit according to claim 14, wherein the memory elements are coupled between the outputs of the shift register and the selection logic.

19. The circuit according to claim 15, wherein the memory elements arc coupled between the outputs of the shift register and the selection logic.

20. An information processing system including at least one electronic circuit for carrying out a trimming operation on circuit portions of an integrated circuit having at least a first input or supply pin, an output pin, and a second supply pin, the circuit comprising:

memory elements;

means for modifying the state of the memory elements; and first and second comparators having their inputs connected to a trimming pin to produce a clock signal for the trimming operation and a sequence of trimming data, wherein a single trimming pin is used.

21. The information processing system according to claim 20, wherein the first comparator has an input coupled to the trimming pin via a voltage divider, and the second comparator has an input coupled to the trimming pin via a different node of the voltage divider.

22. The information processing system according to claim 21, further comprising a shift register connected downstream of the first and second comparators.

23. The information processing system according to claim 20, further comprising a shift register that receives trimming data on one input from the output of the second comparator, and receives a clock signal on another input from the output of the first comparator.

* * * * *